(12) United States Patent
Schultz et al.

(10) Patent No.: US 8,654,533 B2
(45) Date of Patent: Feb. 18, 2014

(54) POWER CORD HEAT SINK

(75) Inventors: Mark Alan Schultz, Billings, MO (US);
Robert Warren Schmidt, Carmel, IN (US)

(73) Assignee: Thomson Licensing, Issy les Moulineax (FR)

( * ) Notice: Subject to any disclaimer, the term of this patent is extended or adjusted under 35 U.S.C. 154(b) by 240 days.

(21) Appl. No.: 13/368,645

(22) Filed: Feb. 8, 2012

(65) Prior Publication Data
US 2013/0201629 A1    Aug. 8, 2013

(51) Int. Cl.
*H05K 7/20*    (2006.01)

(52) U.S. Cl.
USPC ............................ 361/704; 361/709; 165/185

(58) Field of Classification Search
USPC .................................. 361/704, 709; 165/185
See application file for complete search history.

(56) References Cited

U.S. PATENT DOCUMENTS

| | | | |
|---|---|---|---|
| 4,586,774 A * | 5/1986 | Didier | 439/274 |
| 5,894,166 A | 4/1999 | Surridge | |
| 5,974,556 A * | 10/1999 | Jackson et al. | 713/322 |
| 6,198,631 B1 | 3/2001 | Radosavljevic et al. | |
| 6,243,265 B1 | 6/2001 | Wong et al. | |
| 6,430,043 B1 | 8/2002 | Osburn | |
| 7,091,594 B1 | 8/2006 | Kim et al. | |
| 7,677,929 B2 * | 3/2010 | Bradford-Stagg | 439/638 |

FOREIGN PATENT DOCUMENTS

| | | | | |
|---|---|---|---|---|
| JP | 59110308 A * | 6/1984 | | H02G 9/00 |
| JP | 2004273834 | 9/2004 | | |
| JP | 2006135559 A * | 5/2006 | | H04M 1/02 |
| SU | 1095290 A * | 5/1984 | | H02G 3/00 |

OTHER PUBLICATIONS

English translation of Ishikawa, Japense publication JP 2006-135559 A (May 25, 2006), translated on Nov. 17, 2013, 9 pages.*

* cited by examiner

*Primary Examiner* — Robert J Hoffberg
(74) *Attorney, Agent, or Firm* — Robert D. Shedd; Robert B. Levy

(57) ABSTRACT

A power cord (14) for an electronic product (10) such as a set-top box or the like provides a reduced thermal resistance path from a heat generating portion of the set-top to the ambient air to improve heat dissipation. In a preferred embodiment, the power cord includes a ground wire having a size in excess of that necessary to carry ground current to as to increase heat conduction from the ground plane of the set-top box circuit board.

6 Claims, 2 Drawing Sheets

POWER CORD HEAT SINK

TECHNICAL FIELD

This invention relates to a technique for dissipating heat generated by an electronic product.

BACKGROUND ART

Heat dissipation remains a common problem in the design and operation of electronic products. In the past, designers would provide the product with a large form factor (i.e., a large enclosure) with plenty of vents to allow sufficient convection to dissipate heat. In addition to, or in place of a large well-vented enclosure, designers will often include one or more fans to mechanically force air through the enclosure to achieve heat dissipation. Both of these approaches remain in common use today.

Designers of electronic products are now seeking to reduce the form factor which greatly increases the difficulty in dissipating heat. Moreover, concerns about product esthetics and component cost militate against the use of fans, so designers must rely on passive approaches which become increasingly more difficult as the product size shrinks.

Thus, a need exists for a passive approach to dissipating heat from an electronic device.

BRIEF SUMMARY OF THE INVENTION

Briefly, in accordance with a preferred embodiment of the present principles, a method for dissipating heat generated by an electronic product comprises the step of providing a reduced thermal resistance path from a heat generating portion of the electronic device via a power cord connected to the electronic product to conduct heat from away from the electronic product.

DETAILED DESCRIPTION

Figure 1:
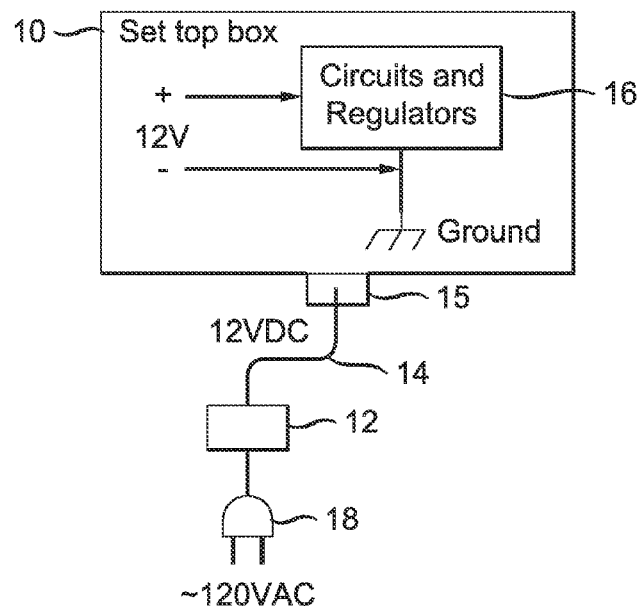
FIG. 1 depicts a simplified schematic diagram of an electronic product in the form of a set-top box and associated power supply.

FIG. 1 depicts a simplified schematic diagram of an electronic product in the form of a set-top box 10 and associated power supply 12. The power supply supplies power to the set-top box 10 through a power cord 14 connected to the set top box by a plug 15 to energize the various circuits and regulators 16 within the set-top box. In practice, the power supply 12 supplies the set-top box 10 with 12 volts DC from a 120 volt AC line connected to the power supply through a plug 18. However, the power supply could operate at a different input voltage to provide the same or a different output voltage.

When energized with power from the power supply 12, the circuits and regulators 16 within the set-top box 10 generate heat. Dissipating the heat generated by the circuits and regulators 16 within the set-top box 10 remains an important concern for designers of the set-top box. Failure to provide for heat dissipation can result in overheating which can lead to component failure. Factors such as reduced form factor, component cost, power consumption and ambient noise militate against the use of a fan so set-top box designers must rely on passive heat dissipation techniques, such as component heat sinks and air vents through the set top box enclosure (not shown).

Figure 2:
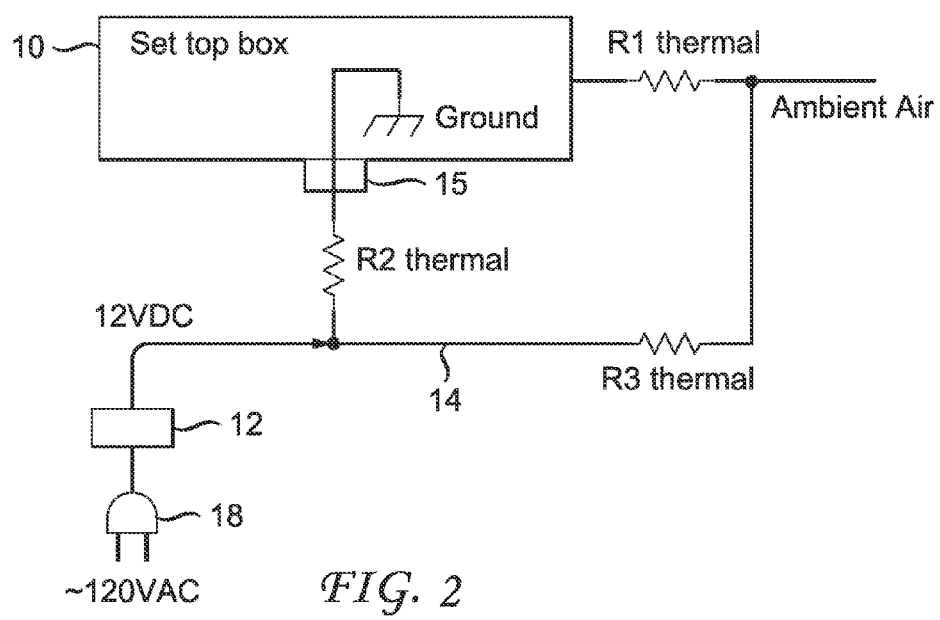
FIG. 2 depicts a circuit model of the set-top box of FIG. 1 to illustrate the thermal resistance of the power cord connecting the set-top box to the power supply.

Presently, the power cord 14 that carries power from the power supply 12 to the set top box 10 has a relatively small size (e.g., 18 gauge wire) because of the relatively modest current drawn by the various circuits and regulators 16 within the set-top box. FIG. 2 depicts a circuit model of the thermal resistance of the power cord 14. As depicted in FIG. 2, resistor R1 represents the thermal resistance of the set-top box 10 to the ambient air. The resistor R2 represents the thermal resistance of the power cord 14 to the set-top box, whereas R3 represents the thermal resistance of the power cord to the ambient air.

Figure 3:
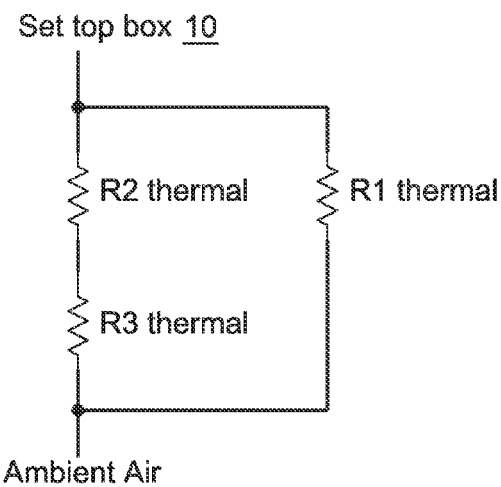
FIG. 3 depicts a circuit model of the set-top box of FIG. 1 to illustrate the thermal resistance of a power cord in accordance with the present principles for providing a reduced thermal resistance path from a heat generating portion of the electronic device to conduct heat from away from the set-top box.

The circuit model of FIG. 2 can be further simplified as shown in FIG. 3. R1, which represents the thermal resistance of the set-top box 10 to the ambient air, depends on the surface area of the enclosure of the set-top box 10 of FIGS. 1 and 2 and the air flow past such surface area. Decreasing the overall size of the set-top box enclosure will decrease its surface area. Assuming the absence of any fan or any increase in the number or size of vents, decreasing the size of the set-top box enclosure will increase the thermal resistance R1 which result in heat build-up and component failure.

Figure 4:
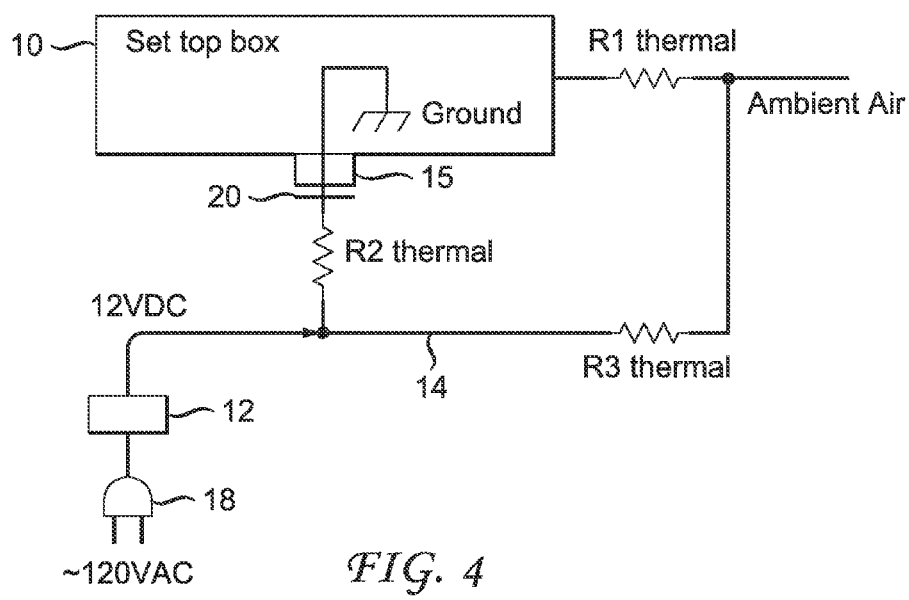
FIG. 4 depicts a circuit model of the thermal resistance of the power cord of set-top box of FIG. 1.

Referring to FIG. 4, applicants have discovered that by modifying the power cord 14 to increase the size of the ground wire within the power cord beyond that necessary to carry ground current, both R2, the thermal resistance of the power cord 14 to the set-top box, and R3 the thermal resistance of the power cord to the ambient air will decrease. Increasing the size of ground wire provides a lower thermal resistance path between the power cord and the set top box. Additionally, increasing the size of the ground wire provides for a larger surface area in contact with the ambient air, thus reducing R3.

Referring back to FIG. 3, increasing the size of the ground wire in the power cord 14 of FIG. 4 to decrease R2 and R3 thus provides a reduced thermal resistance path from the set top box 10 to the ambient air. Thus, increasing the size of the ground wire within the power cord 14 of FIG. 4 will increase heat dissipation, as compared to a ground wire only sized large enough to carry ground currents.

To increase the heat dissipated by the power cord 14 of FIG. 3, the ground conductor of the power cord have not only have an increased, but be connected to connected to the printed circuit board (not shown) at the hottest area of ground plane on the circuit board, not just attached to the edge of the board. Rather than use a single large (oversized) gauge wire as ground conductor within the power cord 14 of FIG. 3, the ground conductor could have a varying diameter so as to be larger (e.g., more copper) exiting from the set-top box and then taper or reduce in diameter after a short distance (e.g., a few inches to a foot out) from the set-top box 10 box where the thermal effects decrease.

To reduce the thermal resistance between the set top box and the ambient air, the plug 15 connecting the set-top box 10 to the power cord 14 of FIG. 3 can have an increased contact area. Moreover, employing a metal connector housing (not shown) on the set-top box 10 for receiving the plug 15 will achieve increased heat dissipation, as compared to a plastic housing. Further, the power cord 14 can include one or more heat-dissipating radiators 20 to further reduce the thermal resistance between the set-top box 10 and the ambient air. The radiators 20 can take the same or different forms. For example, one or more radiators 20 could take the form of a wire spring circumscribing a part of the length of the power cord 14 of FIG. 4. Alternatively, one or more radiators 20 could take the form of a metal annulus circumscribing the power cord 14. Such a metal annulus could have fins like a heat sink.

The foregoing describes a technique for reducing the heat dissipated by an electronic product in the form of a set top box by configuring the power cord to provide a reduced thermal resistance path from a heat generating portion of the electronic device to conduct heat from away from the electronic product.

The invention claimed is:

1. A power cord for an electronic product comprises wherein the power cord, when connected to the electronic product, provides a reduced thermal resistance path from a heat generating portion of the electronic product and supplies power to the electronic product, via a ground wire within the power cord, a portion along a length of the ground wire having a diameter in excess of that necessary to carry a ground current for grounding the electronic device, the portion of the ground wire conducts heat from away from the electronic product, wherein the ground wire tapers along the length from a larger diameter where the power cord exits the electronic product to decreases in diameter in accordance with a distance away from the electronic product.

2. The power cord according to claim 1 further including a radiator for carrying the heat away from the electronic product.

3. The power cord according to claim 1 further including a heat-radiating plug connected to the electronic product.

4. A method for dissipating heat generated by an electronic product comprising:

a step of providing a reduced thermal resistance path from a heat generating portion of the electronic device via a ground wire within a power cord, the power cord supplies power to the electronic product, a portion along a length of the ground wire having a diameter in excess of that necessary to carry a ground current for grounding the electronic device, the portion of the ground wire conducts heat from away from the electronic product; and a step of varying a ground wire diameter of the ground wire as to taper along the length from a larger diameter where the power cord exits the electronic product to decreasing in diameter in accordance with a distance away from the electronic product.

5. The method according to claim 4 further including a step of providing the power cord with a radiator for carrying the heat away from the electronic product.

6. The method according to claim 4 further including a step of providing the power cord with a having a heat-radiating portion connected to the electronic product.

* * * * *